(12) United States Patent
Shimoosako et al.

(10) Patent No.: US 8,889,250 B2
(45) Date of Patent: *Nov. 18, 2014

(54) PLATING TARGET MATERIAL, POLYAMIC SOLUTION AND POLYIMIDE RESIN SOLUTION WHICH ARE USED TO FORM THE PLATING TARGET MATERIAL, AND PRINTED-WIRING BOARD USING THEM

(75) Inventors: Kanji Shimoosako, Kyotanabe (JP); Takashi Ito, Otsu (JP); Shigeru Tanaka, Settsu (JP); Masaru Nishinaka, Otsu (JP); Mutsuaki Murakami, Settsu (JP)

(73) Assignee: Kaneka Corporation, Osaka (JP)

( * ) Notice: Subject to any disclaimer, the term of this patent is extended or adjusted under 35 U.S.C. 154(b) by 1430 days.

This patent is subject to a terminal disclaimer.

(21) Appl. No.: 11/665,226

(22) PCT Filed: Oct. 13, 2005

(86) PCT No.: PCT/JP2005/018848
§ 371 (c)(1),
(2), (4) Date: Jul. 12, 2007

(87) PCT Pub. No.: WO2006/041117
PCT Pub. Date: Apr. 20, 2006

(65) Prior Publication Data
US 2007/0264490 A1 Nov. 15, 2007

(30) Foreign Application Priority Data

Oct. 14, 2004 (JP) ................................. 2004-300234
Oct. 14, 2004 (JP) ................................. 2004-300235

(51) Int. Cl.
*B32B 15/08* (2006.01)
*C23C 18/31* (2006.01)
*C23C 18/20* (2006.01)
*C23C 18/38* (2006.01)
*C08G 73/10* (2006.01)
*H05K 3/46* (2006.01)
*H05K 3/18* (2006.01)
*H05K 1/03* (2006.01)

(52) U.S. Cl.
CPC .......... *C23C 18/31* (2013.01); *H05K 2203/066* (2013.01); *C23C 18/20* (2013.01); *H05K 2201/0154* (2013.01); *C23C 18/38* (2013.01); *H05K 2203/0759* (2013.01); *C08G 73/10* (2013.01); *H05K 3/181* (2013.01); *H05K 1/0346* (2013.01); *H05K 3/4661* (2013.01); *Y10S 428/901* (2013.01)
USPC ........... 428/209; 428/141; 428/447; 428/458; 428/473.5; 428/901

(58) Field of Classification Search
None
See application file for complete search history.

(56) References Cited

U.S. PATENT DOCUMENTS

| 5,178,914 A | 1/1993 | Goldblatt et al. |
| 5,411,795 A | 5/1995 | Silverman |
| 5,859,181 A | 1/1999 | Zhao et al. |
| 6,703,133 B2 * | 3/2004 | Sugo et al. ..................... 428/447 |
| 8,092,900 B2 * | 1/2012 | Shimoosako et al. ......... 428/209 |
| 2003/0049487 A1 * | 3/2003 | Katsuki et al. ................ 428/626 |
| 2003/0170431 A1 * | 9/2003 | Oguni et al. ................... 428/209 |
| 2005/0158574 A1 | 7/2005 | Suzuki et al. |
| 2006/0048963 A1 | 3/2006 | Nishinaka et al. |
| 2006/0115670 A1 | 6/2006 | Tanaka et al. |
| 2007/0269665 A1 * | 11/2007 | Shimoohsako et al. ...... 428/458 |

FOREIGN PATENT DOCUMENTS

| EP | 0 773 710 A1 | 5/1997 |
| JP | 62128186 A * | 6/1987 |
| JP | 7-66329 A | 3/1995 |
| JP | 8-330728 A | 12/1996 |

(Continued)

OTHER PUBLICATIONS

International Preliminary Report on Patentability and Written Opinion of the International Searching Authority for Application No. PCT/JP2005/014353, dated Feb. 6, 2007.
US Office Action for U.S. Appl. No. 11/659,363, dated Jul. 12, 2010.
US Office Action for U.S. Appl. No. 11/659,363, dated Oct. 7, 2009.
Office Action dated Dec. 15, 2010 for U.S. Appl. No. 11/659,363.
U.S. Appl. No. 11/659,363; Office Action; Apr. 27, 2011; pp. 1-6.

*Primary Examiner* — Monique Jackson
(74) *Attorney, Agent, or Firm* — Birch, Stewart, Kolasch & Birch, LLP

(57) ABSTRACT

A laminate of the present invention comprises a plating-target material including a layer-A, that is subjected to electroless copper plating and has a surface roughness such that an arithmetic mean roughness Ra measured at a cutoff value of 0.002 mm is less than 0.5 μm. The 90° anti-peeling adhesive force of the layer-A is 1.0 N/25 mm or less. Furthermore, the layer-A includes a polyimide resin having a siloxane structure formed by polymerizing a diamine component having a structure represented by Formula (6)

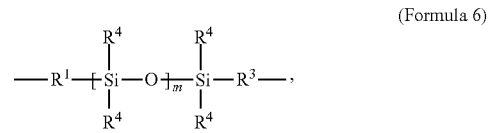

(Formula 6)

in a content of 5 to 95 mol % based on the entire diamine component. A sheet containing the layer-A has an elongation modulus of 1.8 GPa or less. The plating-target material of the present invention has a high adhesiveness to an electroless plating film formed on its surface, even if the surface is not so rough, and it is possible to favorably form electroless plating on the entire surface. Accordingly, the plating-target material and laminate of the present invention is suitably applicable to manufacturing of a printed-wiring board and the like.

5 Claims, No Drawings

(56) References Cited

FOREIGN PATENT DOCUMENTS

| | | |
|---|---|---|
| JP | 2000-198907 A | 7/2000 |
| JP | 2000-290606 A | 10/2000 |
| JP | 2002-264255 A | 9/2002 |
| JP | 2003-7138 A | 1/2003 |
| JP | 2004-10660 A | 1/2004 |
| JP | 2004-014611 A | 1/2004 |
| JP | 2004-14611 A | 1/2004 |
| JP | 2004051910 A * | 2/2004 |
| JP | 2004-189981 A | 7/2004 |
| JP | 2004219853 A * | 8/2004 |
| WO | 2004/050352 A1 | 6/2004 |

* cited by examiner

PLATING TARGET MATERIAL, POLYAMIC SOLUTION AND POLYIMIDE RESIN SOLUTION WHICH ARE USED TO FORM THE PLATING TARGET MATERIAL, AND PRINTED-WIRING BOARD USING THEM

TECHNICAL FIELD

The present invention relates to a plating-target material suitably used in electroless plating, a polyamic acid solution and a polyimide resin solution for use in the plating-target material, and a printed-wiring board formed by using the same. In particular, the present invention relates to the plating-target material, a polyamic acid solution and a polyimide resin solution for use in the plating-target material, and a printed-wiring board formed by using the same, each of which is suitable for use in manufacturing of a printed-wiring board.

BACKGROUND ART

Electroless plating is a widely adopted technology for functionalizing the surface of an insulative material such as: various kinds of plastic, glass, ceramic, and wood. In the electroless plating process, a reducing agent is put in an aqueous solution of metallic salt, so as to precipitate metal on a base material, without a use of electric energy, through a reduction process caused by decomposition of the reducing agent. This electroless plating process can be, for example, a decorative plating process or a functional plating. The decorative plating process is for making a part such as: a grille and marks or the like of an automobile; and knobs or the like of home electronic appliances, by conducting electroless plating on ABS resin or polypropylene resin. The functional plating is for plating through holes of a printed-wiring board, by conducting the electroless plating on ABS resin or polypropylene resin.

However, in many cases, the electroless plating results in low adhesiveness to the surface of the above mentioned various materials. This low adhesiveness of the electroless plating film to the insulative material has been a concern, particularly in the case of manufacturing a printed-wiring board. Especially, in a case of forming a metal layer on an insulative material having a smooth surface and a small surface roughness, it is extremely difficult to firmly adhere an electroless plating to the surface by the method of directly forming an electroless plating film.

This is believed to be caused mainly by a catalyst such as palladium which intervenes between the electroless plating and the surface. Accordingly, to improve the adhesiveness between the circuit wiring and the surface having a small surface roughness, a foundation layer of a metal needs to be formed on the surface of a polyimide film by a physical method such as vapor deposition or spattering, and a copper which is a favorable conductor is formed on the foundation layer thereafter (See Patent Citation 2).

Meanwhile, for example, to form an electroless plating film on an insulative material in manufacturing of a printed-wiring board or the like having thereon wiring, it is preferable that an electroless plating film be firmly formed on the smooth surface of the insulative material.

In order to solve the foregoing problem, the surface of an insulative resin material for printed-wiring board was roughened using various techniques, so that the adhesiveness between the electroless plating film and the surface is acquired by so-called Anchor Effect (See Patent Citation 1 for example). This however raises the following problem. Namely, since the adhesiveness between an electroless plating film and a resin material is low when the surface roughness of the material is small, the roughness of the material surface needs to be increased to achieve a good adhesiveness. This however causes limitation in formation of fine wiring.

[Patent Citation 1]
Japanese Unexamined Patent Publication No. 198907/2000 (Tokukai 2000-198907; published on Jul. 18, 2000)
[Patent Citation 2]
Japanese Unexamined Patent Publication No. 330728/1996 (Tokukaihei 8-330728; Published on Dec. 13, 1996)

DISCLOSURE OF INVENTION

As explained in BACKGROUND ART, conventional arts had no plating-target material having high adhesive force between an insulative resin material and an electroless plating film even though its surface is not so rough and which allows favorable electroless plating to be carried out with respect to an entire surface to be subjected to plating.

Thus, the present invention was made in order to solve the foregoing conventional problems, and an object of the present invention is to provide a plating-target material, having a layer to be subjected to electroless plating, which includes a specific polyimide resin as the layer to be subjected to the electroless plating and whose defined adhesive force and/or elongation modulus of its layer-A allows various materials to be more firmly combined to each other by carrying out the electroless plating with use of the plating-target material even though a surface of the layer-A is not so rough and realizes favorable electroless plating. Particularly, the present invention is favorably applicable to manufacturing and the like of various kinds of printed-wiring boards, and is to further provide (i) a solution and a plating-target material which can be favorably used in manufacturing a printed-wiring board such as a flexible printed-wiring board, a rigid printed-wiring board, a multilayer flexible printed-wiring board, a multilayer rigid wiring board, and a built-up wiring board, each of which is required to have fine wirings, and (ii) a printed-wiring board using them.

The inventors of the present invention diligently studied in view of the foregoing problems. As a result of the diligent study, they found it possible to solve the foregoing problems by using a below-described plating-target material. That is, the present invention includes the following inventions (1) to (8) which are industrially useful.

(1) A plating-target material, comprising at least a layer-A which is to be subjected to electroless plating, wherein the layer-A contains a polyimide resin having one or more structures out of structures respectively represented by Formulas (1) to (6), and a surface roughness of the layer-A is such that an arithmetic mean roughness of measurement at a cutoff value of 0.002 mm is less than 0.5 μm and an anti-peeling adhesive force of a surface of the layer-A is 1.0 N/25 mm or less, $$—R^1\!\!-\!\!(\!R^2\!)_n\!\!-\!\!R^3—, \quad \text{(Formula 1)}$$

$$—R^1—O\!\!-\!\!(\!R^2\!)_n\!\!-\!\!O—R^3—, \quad \text{(Formula 2)}$$

$$—R^1—COO\!\!-\!\!(\!R^2—O\!)_n\!\!-\!\!CO—R^3—, \quad \text{(Formula 3)}$$

$$—R^1\!\!-\!\!(\!O—R^2\!)_n\!\!-\!\!O—R^3—, \quad \text{(Formula 4)}$$

-continued $$—R^1+COO—R^2\overline{)_n}—OCO—R^3—,\quad\text{(Formula 5)}$$

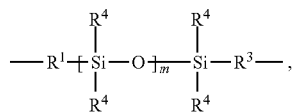
(Formula 6)

where each of $R^1$ and $R^3$ represents a bivalent alkylene group represented by $C_xH_{2x}$ or a bivalent aromatic group, $R^4$ represents an alkyl group, a phenyl group, an alkoxy group, or a phenoxy group, $R^2$ represents a bivalent alkylene group represented by $C_xH_{2x}$ or a bivalent phenylene group, n ranges from 3 to 100, and m is an integer not less than 1.

(2) A plating-target material, comprising at least a layer-A which is to be subjected to electroless plating, wherein, the layer-A contains a polyimide resin having one or more structures out of structures respectively represented by Formulas (1) to (6), and an elongation modulus of the layer-A in a sheet shape is 1.8 GPa or less, $$—R^1+R^2\overline{)_n}—R^3—,\quad\text{(Formula 1)}$$

$$—R^1—O+R^2\overline{)_n}—O—R^3—,\quad\text{(Formula 2)}$$

$$—R^1—COO+R^2—O\overline{)_n}—CO—R^3—,\quad\text{(Formula 3)}$$

$$—R^1+O—R^2\overline{)_n}—O—R^3—,\quad\text{(Formula 4)}$$

$$—R^1+COO—R^2\overline{)_n}—OCO—R^3—,\quad\text{(Formula 5)}$$

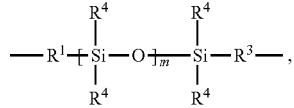
(Formula 6)

where each of $R^1$ and $R^3$ represents a bivalent alkylene group represented by $C_xH_{2x}$ or a bivalent aromatic group, $R^4$ represents an alkyl group, a phenyl group, an alkoxy group, or a phenoxy group, $R^2$ represents a bivalent alkylene group represented by $C_xH_{2x}$ or a bivalent phenylene group, n ranges from 3 to 100, and m is an integer not less than 1.

(3) The plating-target material based on the invention (2), wherein the elongation modulus is 0.1 GPa or more.

(4) The plating-target material based on any one of the inventions (1) to (3), wherein electroless copper plating is carried out as the electroless plating.

(5) A laminate, comprising the layer-A of the invention (1) or (2), wherein the layer-A is subjected to electroless plating.

(6) A printed-wiring board, comprising the plating-target material of any one of the inventions (1) to (4).

(7) A polyimide resin solution, comprising a polyimide resin having one or more structures out of structures respectively represented by Formulas (1) to (6), wherein the polyimide resin solution is used to form the layer-A of the invention (1) or (2), $$—R^1+R^2\overline{)_n}—R^3—,\quad\text{(Formula 1)}$$

$$—R^1—O+R^2\overline{)_n}—O—R^3—,\quad\text{(Formula 2)}$$

$$—R^1—COO+R^2—O\overline{)_n}—CO—R^3—,\quad\text{(Formula 3)}$$

$$—R^1+O—R^2\overline{)_n}—O—R^3—,\quad\text{(Formula 4)}$$

$$—R^1+COO—R^2\overline{)_n}—OCO—R^3—,\quad\text{(Formula 5)}$$

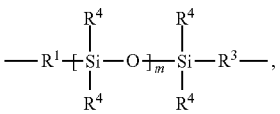
(Formula 6)

where each of $R^1$ and $R^3$ represents a bivalent alkylene group represented by $C_xH_{2x}$ or a bivalent aromatic group, $R^4$ represents an alkyl group, a phenyl group, an alkoxy group, or a phenoxy group, $R^2$ represents a bivalent alkylene group represented by $C_xH_{2x}$ or a bivalent phenylene group, n ranges from 3 to 100, and m is an integer not less than 1.

(8) A polyamic acid solution, comprising a polyamic acid having one or more structures out of structures respectively represented by Formulas (1) to (6), wherein the polyamic acid solution is used to form the layer-A of the invention (1) or (2), $$—R^1+R^2\overline{)_n}—R^3—,\quad\text{(Formula 1)}$$

$$—R^1—O+R^2\overline{)_n}—O—R^3—,\quad\text{(Formula 2)}$$

$$—R^1—COO+R^2—O\overline{)_n}—CO—R^3—,\quad\text{(Formula 3)}$$

$$—R^1+O—R^2\overline{)_n}—O—R^3—,\quad\text{(Formula 4)}$$

$$—R^1+COO—R^2\overline{)_n}—OCO—R^3—,\quad\text{(Formula 5)}$$

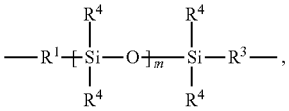
(Formula 6)

where each of $R^1$ and $R^3$ represents a bivalent alkylene group represented by $C_xH_{2x}$ or a bivalent aromatic group, $R^4$ represents an alkyl group, a phenyl group, an alkoxy group, or a phenoxy group, $R^2$ represents a bivalent alkylene group represented by $C_xH_{2x}$ or a bivalent phenylene group, n ranges from 3 to 100, and m is an integer not less than 1.

The present invention is arranged so that: there is provided the layer-A, subjected to electroless plating, which is made of the polyimide resin having a specific structure, and an adhesive force and/or an elongation modulus of the layer-A are defined, thereby providing, particularly, a target which has high adhesive force with respect to an electroless plating layer even though its surface is not so rough, which has excellent adhesive force with respect to various kinds of materials, and which is excellent in circuit formation.

Thus, the plating-target material of the present invention is first formed on a material surface which is to be subjected to electroless plating, and then electroless plating is carried out, so that the plating-target material of the present invention serves as an interlayer adhesive, thereby realizing such an advantage that the electroless plating layer and the material are firmly combined to each other.

Further, the plating-target material of the present invention has the polyimide resin, so that the plating-target material has excellent heat resistance. As a result, the plating-target material is favorably applicable to manufacturing of various kinds of printed-wiring boards. Moreover, due to its high adhesive force with respect to the electroless plating layer with it free from any particular necessity to make the surface rough, the plating-target material is favorably applicable to manufacturing of a printed-wiring board such as a flexible printed-wiring board, a rigid printed-wiring board, a multilayer flexible printed-wiring board, a multilayer rigid wiring board, and a built-up wiring board, each of which is required to have fine wirings.

Additional objects, features, and strengths of the present invention will be made clear by the description below. Further, the advantages of the present invention will be evident from the following explanation in reference to the drawings.

BEST MODE FOR CARRYING OUT THE INVENTION

An embodiment of the present invention is described below. Note that the present invention is not limited to the following.

(Plating Target, Characteristic of Solution, and Material Structure of the Present Invention)

A plating-target material of the present invention has a layer-A which includes a polyimide resin. The polyimide resin has at least one of the structures respectively represented by the Formula (1) through (6). The surface roughness of the layer-A is such that an arithmetic mean roughness of measurement at a cutoff value of 0.002 mm is less than 0.5 μm and an anti-peeling adhesive force of a surface of the layer-A is 1.0 N/25 mm or less. Further, the adhesive force of the layer-A against a 90°-peeling force (Hereinafter, 90° anti-peeling adhesive force) is 1.0 N/25 mm or less.

By using the polyimide resin in the layer-A and defining the adhesive force of the layer-A, it is possible to achieve a good adhesiveness to an electroless plating film, and a good formability of circuit, even if the surface of the layer-A is less than 0.5 μm in Ra and is barely rough.

Further, the characteristic of a plating-target material of the present invention includes a layer-A to be subjected to an electroless plating process. Further, the layer-A includes a polyimide resin having at least one of the structures respectively represented by the Formulas (1) through (6), and the elongation modulus of the layer-A is 1.8 GPa or less. Here, the layer-A of the present invention is a layer of 10 Å or more in thickness.

By using the polyimide resin in the layer-A, and limiting the elongation modulus of the layer-A within a specific range, a good adhesiveness to the electroless plating film is achieved without a process of roughening the surface.

A plating-target material of the present invention may be any material of any form, provided that the layer-A is included. For example, when using a plating-target material of the present invention for a printed-wiring board, the plating-target material may be: a material made of the layer-A only; a material including the layer-A, and a layer-B which faces a circuit having been formed; or a material including the layers A and B, and a polymer film C interposed between these layers A and B. Further, the plating-target material may be a material including the layer-A and the polymer C, or a material including two layers-A, and the polymer film C interposed between these layers-A.

To obtain a plating-target material of the present invention, a solution containing the polyimide resin having at least one of the structures respectively represented by the Formulas (1) through (6) is suitably used. Further, to obtain a plating-target material of the present invention, a solution containing the polyamic acid having at least one of the structures respectively represented by the Formulas (1) through (6) is suitably used.

Although the plating-target material of the present invention is not limited as long as it at least includes the layer-A to be subjected to electroless plating, it is preferred to first form the plating-target material of the present invention on a material surface to be subjected to electroless plating, and conduct the electroless plating thereafter. This causes the plating-target material of the present invention to serve as an interlayer adhesive, thus yielding an advantageous effect that the electroless plating and the material are firmly combined with each other. Utilizing this advantageous effect, the present invention is applicable to decorative or functional plating of various purposes. Particularly, the plating-target material of the present invention is suitable for a printed-wiring board. This is because the plating-target material is advantageous in that an electroless plating layer is securely formed, even if the roughness of the surface is not so rough, and that the plating-target material is heat-resistant.

The following describes the plating-target material of the present invention, assuming that the plating-target material of the present invention is applied to a printed-wiring board.

(Layer-A)

The layer-A is a layer whose surface is subjected to an electroless plating process. It is important that this layer-A includes a polyimide resin having at least one of the structures respectively represented by the Formulas (1) through (6). The inventors of the present invention found that a good adhesiveness of an electroless plating is obtained, if a material surface to be subjected to electroless plating includes the polyimide resin having at least one of the structures respectively represented by the Formulas (1) through (6).

Here, the layer-A of the present invention is a surface of 10 Å or more in thickness (the layer-A having the surface to be subjected to the electroless plating is sometimes referred to as surface-A, hereinbelow.) Further, for example, if the plating-target material of the present invention having the surface-A is in a form of sheet, the both surfaces of the sheet are referred to as surface-A.

Further, it is also important to design the constituting resins and their combination so that the adhesive force of the layer-A against the peeling force is 1.0 N/25 mm or less.

Specifically, the surface of the layer-A of the present invention is not so rough, and is such that an arithmetic mean roughness Ra measured at a cutoff value of 0.002 mm is less than 0.5 μm. A long as these conditions are met, the plating-target material of the present invention, when used for a printed-wiring board, allows good formation of fine wiring. Therefore, a remarkable effect is obtained by using the material of the present invention for a printed-wiring board. In consideration of the formability of fine wiring, the arithmetic mean roughness Ra is preferably less than 0.3 μm, and is more preferably less than 0.1 μm. A caution is needed when the Ra is 0.5 μm or more. This is particularly true when using the plating-target material of the present invention for a printed-wiring board, because the surface irregularity is enhanced, causing difficulty in forming fine wiring.

The arithmetic mean roughness Ra is defined in JIS B 0601 (Revised on Feb. 1, 1994). Specifically, in the present invention, a value of the arithmetic mean roughness Ra is a numerical value obtained through observation of a surface using an optical-interference type surface structure analyzing device. As is defined in JIS B 0601, the cutoff value in the present invention is a wavelength which is set when deriving a roughness curve from a profile curve (measured data). That is, the value of Ra measured at the cutoff value of 0.002 mm is the arithmetic mean roughness calculated from a roughness curve which excludes irregularity whose wavelength is 0.002 mm longer than the measured data.

Further, in the present invention, the adhesive force of the layer-A is an adhesive force against 90°-peeling force (90° anti-peeling adhesive force). The following describes in detail how this anti-peeling adhesive force is measured. SUS302 steel plate defined in JIS G4305 is used as a testing plate. A rubber roller is reciprocated once at the speed of 300 mm/min, so as to apply a load of 2000 g to the layer-A and the testing plate, thus bonding them with each other by application of a pressure. Then, a 90°-peeling experiment is conducted at a speed of 300 mm/min, using the sample thus prepared, so as to measure the 90° anti-peeling adhesive force.

The 90° anti-peeling adhesive force is 1.0 N/25 mm or less, and is preferably 0.7 N/25 mm or less. More preferably, the 90° anti-peeling adhesive force is 0.5 N/25 mm or less. The 90° anti-peeling adhesive force of more than 1.0 N/25 mm causes a poor formation of an electroless plating on the layer-A. In other words, it may be difficult to evenly form an electroless plating film on the surface subjected to an electroless plating process. Moreover, the 90° anti-peeling adhesive force exceeding 1.0 N/25 mm may negatively affect formation of fine wiring, in the case of a printed-wiring board.

Further, it is also important to design the composition of resins and how they are blended so that the elongation modulus of the layer-A is 1.8 GPa or less. Here, whether or not the elongation modulus is 1.8 GPa or less is confirmed as follows. A sheet made of the layer-A of 25 μm in thickness is prepared, and the elongation modulus of the sheet is measured according to JIS K 7127. More specifically, a resin solution for forming the layer-A is prepared, and is applied by flow casting the solution on a shine surface of a rolled copper film (BHY22BT, Produced by Japan Energy Corporation) in such a manner that the thickness of the resin, after being dried, is 25 μm. The sheet is obtained after the resin solution has been dried and the volatile matter has been sufficiently removed.

The rolled copper is removed through etching by using an etchant of hydrochloric acid/ferric chloride series, and the sheet was dried at 60° C. for 30 min. Thus, a sheet of the layer-A of 25 μm in thickness is obtained. Then, a test piece of 10 mm in width, and 80 mm in length is cut out from the sheet. The elongation modulus is measured by conducting a tension test in the ordinary state, at the speed of 5 mm/min, and the Chuck interval of 60 mm.

When the elongation modulus of the layer-A is higher than 1.8 GPa, the adhesiveness of an electroless plating film to the layer-A decreases. A possible reason for this is that the layer-A is stiff, and lacks viscosity when the elongation modulus is higher than 1.8 GPa. This causes the plated copper plating and the layer-A to easily peel off each other at their interface.

Further, in the present invention, there is a preferred lower limit for the elongation modulus. That is, the elongation modulus is preferably 0.1 GPa or higher. The elongation modulus smaller than 0.1 GPa causes a poor formability of an electroless plating. In other words, with this elongation modulus, it may be difficult to evenly form an electroless plating film on the surface subjected to the electroless plating process. Moreover, the elongation modulus may negatively affect the formation of fine wiring, in the case of a printed-wiring board.

Next, described is a polyimide resin of the present invention.

A polyimide resin of the present invention is polyimide resin having at least one of structures shown by the Formulas (1) through (6):

  (Formula 1)

  (Formula 2)

  (Formula 3)

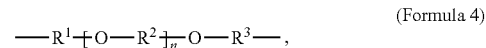  (Formula 4)

  (Formula 5)

  (Formula 6)

(where each of $R^1$ and $R^3$ represents a bivalent alkylene group represented by $C_xH_{2x}$ or a bivalent aromatic group, $R^4$ represents an alkyl group, a phenyl group, an alkoxy group, or a phenoxy group, $R^2$ represents a bivalent alkylene group represented by $C_xH_{2x}$ or a bivalent phenylene group, n ranges from 3 to 100, and m is an integer not less than 1).

For example, such a resin is produced by the following methods.

[1] Producing a polyamic acid which is the precursor of the polyimide resin, by using an acid dianhydride or a diamine component having at least one of the structures respectively represented by the Formulas (1) through (6), and then imidizing the produced polyamic acid.

[2] Producing a polyamic acid having a functional group by using an acid dianhydride or a diamine component having a functional group, producing a polyamic acid having at least one of the structures respectively represented by the Formulas (1) through (6) by causing a reaction amongst the polyamic acid having the functional group, a functional group which would react with the functional group, and a compound having at least one of the structures respectively represented by the Formulas (1) through (6), and then imidizing the polyamic acid to produce a polyimide resin.

[3] Producing a polyamic acid having a functional group by using an acid dianhydride or a diamine component having a functional group, producing a polyimide having the functional group, and causing a reaction amongst the polyimide having the functional group, a functional group which would react with the functional group in the polyimide, and a compound having at least one of the structures respectively represented by the Formulas (1) through (6) to produce a polyimide resin having at least one of the structures respectively represented by the Formulas (1) through (6).

Preferred amongst these methods is the method of producing a polyimide resin by reacting (a) an acid dianhydride, and (b) a diamine having at least one of the structures respectively represented by the Formulas (1) through (6). This is because a diamine having at least one of the structures of the Formulas (1) through (6) is relatively easily available.

Next, the following describes an exemplary method of producing the polyimide resin of the present invention by using a diamine having at least one of the structures of the Formulas (1) through (6).

The acid dianhydride is not particularly limited. For example, the acid dianhydride may be: an aromatic tetracarboxylic acid dianhydride such as pyromellitic dianhydride, 3,3',4,4'-benzophenone tetracarboxylic acid dianhydride, 3,3',4,4'-diphenyl sulfone tetracarboxylic acid dianhydride, 1,4,5,8-naphthalene tetracarboxylic acid dianhydride, 2,3,6,7-naphthalene tetracarboxylic acid dianhydride, 4,4'-oxydiphthalic acid anhydride, 3,3',4,4'-dimethyl diphenyl silane tetracarboxylic acid dianhydride, 1,2,3,4-furantetracarboxylic acid dianhydride, 4,4'-bis(3,4-dicarboxy phenoxy)diphenyl propanoic acid dianhydride, 3,3',4,4'-biphenyl tetracarboxylic acid dianhydride, and 2,3,3',4'-biphenyl tetracarboxylic acid dianhydride; 4,4'-hexafluoro isopropylidene diphthalic acid anhydride; 4,4'-oxydiphthalic acid anhydride; 3,4'-oxydiphthalic acid anhydride; 3,3'-oxydiphthalic acid anhydride; 4,4'-(4,4'-isopropylidene diphenoxy)bis(phthalic anhydride); 4,4'-hydroquinone bis(phthalic anhydride); 2,2-bis(4-hydroxyphenyl)propane dibenzoate-3,3',4,4'-tetracarboxylic acid dianhydride; 1,2-ethylene bis(trimellitic acid monoester anhydride); and p-phenylene bis(trimellitic acid monoester anhydride). The acid dianhydride may be one of the listed substances or a combination of two or more of these substances.

Here, a use of an acid dianhydride having no flexuous coupling group (e.g., pyromellitic dianhydride) tends to result in a polyimide resin with a lower adhesiveness. On the contrary, a use of an acid dianhydride having a flexuous coupling group (e.g. 4,4'-(4,4'-isopropylidene diphenoxy)bis(phthalic anhydride)) tends to result in a polyimide resin with improved adhesiveness. Furthermore, a use of an acid dianhydride having no flexuous coupling group (e.g., pyromellitic dianhydride) tends to result in a less soluble polyimide resin. On the contrary, a use of an acid dianhydride having a flexuous coupling group (e.g. 4,4'-(4,4'-isopropylidene diphenoxy)bis (phthalic anhydride)) tends to result in a polyimide resin with an improved solubility. It is important to select the acid dianhydride, taking into account these tendencies in the adhesiveness and solubility.

Next the diamine component is described. The diamine component of the present invention includes diamine having a structure shown by the Formulas (1) through (6):

  (Formula 1)

  (Formula 2)

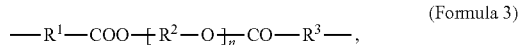  (Formula 3)

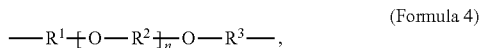  (Formula 4)

  (Formula 5)

  (Formula 6)

(where each of $R^1$ and $R^3$ represents a bivalent alkylene group represented by $C_xH_{2x}$ or a bivalent aromatic group, $R^4$ represents an alkyl group, a phenyl group, an alkoxy group, or a phenoxy group, $R^2$ represents a bivalent alkylene group represented by $C_xH_{2x}$ or a bivalent phenylene group, n ranges from 3 to 100, and m is an integer not less than 1).

A use of a diamine component containing a diamine having at least one of the structures of the Formulas (1) through (6) results in a polyimide resin which firmly combines with the electroless plating layer.

Examples of a diamine having the structure of the Formula (1) are hexamethylene diamine and octamethylene diamine. Examples of a diamine having the structure of the Formula (2) are: 1,3-bis(4-amino phenoxy) propane; 1,4-bis(4-amino phenoxy) butane; 1,5-bis(4-amino phenoxy)pentane. Examples of a diamine having the structure of the Formula (3) are: ELASMER 1000P; ELASMER 650P; and ELASMER 250P (Ihara Chemical Industry Co., Ltd.). Note that $R^2$ in the Formula (3) is $C_4H_8$, in the case of ELASMER. Additionally, examples of a diamine having the structure shown by the general expression (4) are polyether polyamine or polyoxyalkylene polyamine, and more specifically such a diamine may be: Jeffamine® D-2000; Jeffamine® D-4000 (Huntsman Corporation). Furthermore, examples of a diamine having the structure of the Formula (6) are: 1,1,3,3-tetramethyl-1,3-bis(4-amino phenyl)disiloxane; 1,1,3,3-tetraphenoxy-1,3-bis(4-aminoethyl)disiloxane; 1,1,3,3,5,5-hexamethyl-1,5-bis(4-aminophenyl)trisiloxane; 1,1,3,3-tetraphenyl-1,3-bis(2-aminophenyl)disiloxane; 1,1,3,3-tetraphenyl-1,3-bis(3-aminopropyl)disiloxane; 1,1,5,5-tetraphenyl-3,3-dimethyl-1,5-bis(3-aminopropyl)trisiloxane; 1,1,5,5-tetraphenyl-3,3-dimethoxy-1,5-bis(3-aminobutyl)trisiloxane; 1,1,5,5-tetraphenyl-3,3-dimethoxy-1,5-bis(3-amino pentyl) trisiloxane; 1,1,3,3-tetramethyl-1,3-bis(2-aminoethyl) disiloxane; 1,1,3,3-tetramethyl-1,3-bis(3-aminopropyl) disiloxane; 1,1,3,3-tetramethyl-1,3-bis(4-aminobutyl) disiloxane; 1,3-dimethyl-1,3-dimethoxy-1,3-bis(4-aminobutyl)disiloxane; 1,1,5,5-tetramethyl-3,3-dimethoxy-1,5-bis(2-aminoethyl)trisiloxane; 1,1,5,5-tetramethyl-3,3-dimethoxy-1,5-bis(4-amino butyl)trisiloxane; 1,1,5,5-tetramethyl-3,3-dimethoxy-1,5-bis(5-aminopentyl) trisiloxane; 1,1,3,3,5,5-hexamethyl-1,5-bis(3-aminopropyl) trisiloxane; 1,1,3,3,5,5-hexaethyl-1,5-bis(3-aminopropyl) trisiloxane; 1,1,3,3,5,5-hexapropyl-1,5-bis(3-aminopropyl) trisiloxane; or the like. In addition, examples of an diamine which is relatively easily available, and which has the structure of the Formula (6) are: KF-8010; X-22-161A; X-22-161B; X-22-1660B-3; KF-8008; KF-8012; and X-22-9362, each of which is produced by Shin-Etsu Chemical Industry Co., Ltd. The above listed diamines having the structures of the Formulas (1) through (6) may be used singly, or in combination of two or more.

Here, it is preferable that the above diamine(s) be used in combination with another diamine, so that the adhesiveness and/or the elongation modulus is/are brought within the range of the present invention. The other diamine component can be selected from a wide variety of diamines, for example: m-phenylenediamine; o-phenylenediamine; p-phenylenediamine; m-amino benzylamine; p-amino benzylamine; bis(3-aminophenyl)sulfide; (3-amino phenyl)(4-amino phenyl) sulfide; bis(4-aminophenyl)sulfide; bis(3-aminophenyl) sulfoxide; (3-amino phenyl)(4-aminophenyl) sulfoxide; bis(3-aminophenyl)sulfone; (3-aminophenyl)(4-aminophenyl) sulfone; bis(4-amino phenyl)sulfone; 3,4'-diamino benzophenone; 4,4'-diamino benzophenone; 3,3'-diamino diphenyl methane; 3,4'-diamino diphenyl methane; 4,4'-diamino diphenyl methane; 4,4'-diamino diphenyl ether; 3,3'-diamino diphenyl ether; 3,4'-diamino diphenyl ether; bis[4-(3-amino phenoxy)phenyl]sulfoxide; bis[4-(amino phenoxy)

phenyl]sulfoxide; 4,4'-diamino diphenyl ether; 3,4'-diamino diphenyl ether; 3,3'-diamino diphenyl ether; 4,4'-diamino diphenyl thioether; 3,4'-diamino diphenyl thioether; 3,3'-diamino diphenyl thioether; 3,3'-diamino diphenyl methane; 3,4'-diamino diphenyl methane; 4,4'-diamino diphenyl methane; 4,4'-diamino diphenyl sulfone; 3,4'-diamino diphenyl sulfone; 3,3'-diamino diphenyl sulfone; 4,4'-diamino benzanilide; 3,4'-diamino benzanilide; 3,3'-diamino benzanilide; 4,4'-diamino benzophenone; 3,4'-diamino benzophenone; 3,3'-diamino benzophenone; bis[4-(3-amino phenoxy)phenyl]methane; bis[4-(4-amino phenoxy)phenyl]methane; 1,1-bis[4-(3-amino phenoxy)phenyl]ethane; 1,1-bis[4-(4-amino phenoxy)phenyl]ethane; 1,2-bis[4-(3-amino phenoxy)phenyl]ethane; 1,2-bis[4-(4-amino phenoxy)phenyl]ethane; 2,2-bis[4-(3-amino phenoxy)phenyl]propane; 2,2-bis[4-(4-amino phenoxy)phenyl]propane; 2,2-bis[4-(3-amino phenoxy)phenyl]butane; 2,2-bis[3-(3-amino phenoxy)phenyl]-1,1,1,3,3,3-hexafluoro propane; 2,2-bis[4-(4-amino phenoxy)phenyl]-1,1,1,3,3,3-hexafluoro propane; 1,3-bis(3-amino phenoxy)benzene; 1,4-bis(3-amino phenoxy)benzene; 1,4'-bis(4-amino phenoxy)benzene; 4,4'-bis(4-amino phenoxy) biphenyl; bis[4-(3-amino phenoxy)phenyl]ketone; bis[4-(4-amino phenoxy)phenyl]ketone; bis[4-(3-amino phenoxy)phenyl]sulfide; bis[4-(4-amino phenoxy)phenyl]sulfide; bis[4-(3-amino phenoxy)phenyl]sulfone; bis[4-(4-amino phenoxy)phenyl]sulfone; bis[4-(3-amino phenoxy) phenyl]ether; bis[4-(4-amino phenoxy)phenyl]ether; 1,4-bis[4-(3-aminophenoxy)benzoyl]benzene; 1,3-bis[4-(3-amino phenoxy)benzoyl]benzene; 4,4'-bis[3-(4-amino phenoxy) benzoyl]diphenyl ether; 4,4'-bis[3-(3-amino phenoxy)benzoyl]diphenyl ether; 4,4'-bis[4-(4-amino-α,α-dimethyl benzyl)phenoxy]benzophenone; 4,4'-bis[4-(4-amino-α,α-dimethyl benzyl)phenoxy]diphenyl sulfone; bis[4-{4-(4-amino phenoxy)phenoxy}phenyl]sulfone; 1,4-bis[4-(4-amino phenoxy)-α,α-dimethyl benzyl]benzene; 1,3-bis[4-(4-amino phenoxy)-α,α-dimethyl benzyl]benzene; and 3,3'-dihydroxy-4,4'-diamino biphenyl.

Here, a diamine component using the other diamine in combination with the diamine having at least one of the structures of the Formulas (1) through (6) results in a lower adhesiveness than a diamine component only having the diamine having at least one of the structures of the Formulas (1) through (6).

Further, the elongation modulus tends to improve, when using a diamine having no flexuouse coupling group as is p-phenylene diamine. On the other hand, the elongation modulus tends to decrease, when using a diamine having a flexuouse coupling group such as bis[4-(4-amino phenoxy) phenyl]sulfone, or when using a diamine having a meta-connection such as 1,3-bis(3-amino phenoxy).

Further, it is possible to control the adhesiveness and/or the elongation modulus by the quantity of the diamine having at least one of the structures of the Formulas (1) through (6). Namely, by decreasing the quantity of the diamine, the adhesiveness tends to decrease and the modulus tends to increase. On the contrary, by decreasing the quantity of the diamine, the adhesiveness tends to increase and the modulus tends to decrease. Thus, the adhesiveness and the elongation modulus can be controlled with a diamine component having an acid anhydride component, a diamine having at least one of the structures of the Formulas (1) through (6), and another diamine which can be used in combination.

The content of diamine having at least one of the structures of the Formulas (1) through (6) in the entire diamine component is preferably 2 to 98 mol %, and is more preferably 5 to 95 mol %. The adhesive strength tends to decrease when the content of the diamine in the entire diamine component is less than 2 mol %. On the contrary, when the content of the diamine in the entire diamine component exceeds 98 mol %, the formability of an electroless plating tends to be deteriorated.

The polyimide is obtained by dehydration ring closure of the corresponding precursor polyamic acid polymer. The polyamic acid polymer is obtained by causing a reaction between substantially equimolar amounts of the acid dianhydride and the diamine component.

An example of representative process of the reaction is to (i) dissolve or disperse in an organic polar solution at least one kind of diamine component, and then (ii) add at least one kind of acid dianhydride component, to produce a polyamic acid solution. The order of adding monomers is not particularly limited. It is possible to first add an acid dianhydride component to an organic polar solvent, and then add the diamine component, to produce a solution of a polyamic acid polymer. Alternatively, it is possible to first add suitable amount of a diamine component in an organic polar solvent, then add an excessive amount of acid dianhydride component, and then add an amount of the diamine component corresponding to the excessive amount, to produce a solution of polyamic acid polymer. There are also various kinds of adding methods known by a person with ordinary skills in the art, such as the following methods.

Here, the word "dissolve" encompasses a state in which a solute is completely dissolved, and a state in which solute is evenly dispersed or a dispersed in such a manner as to create a similar state to the state in which the solute is dissolved. The time and temperature of the reaction are not particularly limited.

(1) Dissolving a diamine component in an organic polar solvent, and causing a reaction between substantially equimolar amounts of the diamine component and an acid dianhydride.

(2) Causing a reaction between an acid dianhydride component and an excessively smaller molar quantity of diamine component to produce a prepolymer having an acid anhydride group on both ends, and causing a polymerization by using the diamine component in such a manner that the respective molar amounts of acid dianhydride component and the diamine component are substantially equal to each other through out the entire process.

(3) Causing a reaction between an acid dianhydride component and an excessively larger molar quantity of diamine component to produce a prepolymer having an amino group on both ends, and further add the diamine component, and then causing a polymerization by using the dianhydride component in such a manner that the respective molar amounts of acid dianhydride component and the diamine component are substantially equal to each other through out the entire process.

(4) Dissolving and/or dispersing an acid dianhydride component in an organic polar solvent, and causing polymerization using the diamine component in such a manner that the respective molar amounts of the acid dianhydride and the diamine component are substantially equal to each other.

(5) Causing polymerization by a reaction between substantially equimolar amounts of an acid dianhydride and a diamine component in an organic polar solvent.

Examples of an organic polar solvent for use in polymerizing reaction of a polyamic acid are: a solvent of a sulfoxide series such as dimethyl sulfoxide and diethyl sulfoxide; a solvent of a formamide series such as N,N-dimethyl formamide and N,N-diethylformamide; a solvent of an acetamide series such as N,N-dimethyl acetamide and N,N-diethyl acetamide; a solvent of a pyrrolidone series such as N-methyl-2-pyrrolidone and N-vinyl-2-pyrrolidone; a solvent of a phenol series such as phenol, o-, m- or p-cresol, xylenol, halogenated phenol, and catechol; or hexamethyl phosphoramide, and λ-butyrolactone. Each of these organic polar solvents may be used as needed in combination with xylene, or hydrocarbon of the aromatic series such as toluene.

A polyimide is produced from the polyamic acid solution thus obtained, by subjecting the polyamic acid solution to a thermal or chemical cure to cause dehydration ring closure. Here, in the thermal cure, the polyamic acid solution is heat-treated and dehydrated. On the other hand, a dehydrating agent is used to dehydrate the solution in the chemical cure. Either one of thermal or chemical cure can be adopted to cause dehydration ring closure. It is also possible to adopt a method of causing imidization by heating under a reduced pressure. The following describes each of these methods.

An exemplary method of causing dehydration ring closure by chemical cure is a method in which the polyamic acid solution is subject to a heat treatment so that the imidizing reaction of the solution progresses while the solvent is evaporated at the same time. Through this method, a solid polyimide resin is obtained. The condition of the heating is not particularly limited; however, the heating is preferably conducted at 200° C. or lower, for a period ranging from 1 second to 200 minutes.

Further, an exemplary method of causing dehydration ring closure by chemical cure is a process in which a stoichiometric amount or larger amounts of dehydrating agent and catalyst are added to the polyamic acid solution, to cause a dehydration reaction to evaporate the solvent. Through this method, a solid polyimide resin is obtained. Examples of the dehydrating agent are: aliphatic acid anhydride such as acetic anhydride; and an acid anhydride of the aromatic series such as benzoic anhydride. Further, examples of the catalyst are: an aliphatic tertiary amine such as triethylamine; an aromatic series tertiary amine such as dimethylaniline; and a heterocyclic tertiary amine such as pyridine, α-picoline, β-picoline, γ-picoline, and isoquinoline. The chemical dehydration ring closure process is preferably conducted at a temperature of 100° C. or lower. The organic solvent is preferably evaporated at 200° C. or lower, taking a period ranging from 5 minutes to 120 minutes.

There is also a method for obtaining a polyimide resin, which method involves no evaporation of the solvent in the chemical or thermal cure to cause dehydration ring closure. Specifically, in the method, a polyimide solution obtained by conducting a chemical imidization treatment using a dehydrating agent or a thermal imidization treatment is put in a poor solvent, to have a polyimide resin precipitated. Then, unreacted monomer is removed, and the precipitated polyimide resin is purified and dried, thereby producing a solid polyimide resin. For the poor solvent, selected is a poor solvent which mixes well with a solvent, but which does not dissolve polyimide very well. Examples of such a poor solvent are: acetone; methanol; ethanol; isopropanol; benzene; methyl cellosolve; methylethylketone, or the like. However, the poor solvent is not limited to these.

Next described is a method of causing imidizing reaction under a reduced pressure. In this method, water generated in the imidizing reaction is proactively removed to the outside the system. This restrains hydrolysis of the polyamic acid, and results in a high molecular mass of the polyimide. Further, with this method, a substance with ring-opening on one side or both sides (i.e., impurity in the acid dianhydride which is an ingredient) is re-closed. Thus, a further improvement in the molecular mass is expected.

In this method of causing imidizing reaction by heating under a reduced pressure, the condition of the heating is preferably 80 to 400° C. A temperature of 100° C. or higher is more preferable, because the efficiencies of imidizing reaction and water removal are improved. It is further preferable that the heating condition be 120° C. or higher. The highest temperature is preferably a temperature equals to or lower than the heat decomposition point of the targeted polyimide. The highest temperature is usually set at an imidization completion temperature which is approximately between 250 and 350° C.

The pressure under the reduced pressure is preferably small. Specifically, such a pressure is $9 \times 10^4$ to $1 \times 10^2$ Pa, preferably $8 \times 10^4$ to $1 \times 10^2$ Pa, and is more preferably $7 \times 10^4$ to $1 \times 10^2$ Pa.

The polyimide resin is as described above. It is also possible to use a commercially available polyimide resin. Examples of a relatively easily-available polyimide resin which can be used for the plating-target material of the present invention, and which has the structure of the Formula (6) are: X-22-8917; X-22-8904; X-22-8951; X-22-8956; X-22-8984; X-22-8985, each of which is a polyimide solution produced by Shin-Etsu Chemical, Co., Ltd.

For the purpose of adjusting the adhesiveness and/or elongation modulus, the layer-A may include another component in addition to the above-described polyimide resin. As the other component, a thermoplastic resin or thermosetting resin can be used as needed.

Examples of the thermoplastic resin are: polysulfone resin; polyethersulfone resin; polyphenylene ether resin; phenoxy resin; or acid dianhydride; and thermoplastic polyimide resin or the like. Each of these resins may be used singly or in a suitable combination.

Further, examples of the thermosetting resin are: bis maleimide resin; bis allyl-nadi-imide resin; phenol resin; cyanate resin; epoxy resin; acrylic resin; methacrylate resin; triazine resin; hydrosilyl cured resin; allyl cured resin; and unsaturated polyester resin. These resins may be used singly or in a suitable combination. Further, beside the thermosetting resin, it is possible to use side-chain reactive group type thermosetting polymer including, at an end or a side-chain of a polymer chain, a reactive group such as: epoxy group; allyl group; vinyl group; alkoxy silyl group; and hydrosilyl group. Note that provision of a thermosetting resin tends to result in a lower adhesiveness and/or an improved elongation modulus of the obtained layer-A.

Further, for the purpose of adjusting the adhesiveness and/or elongation modulus of the layer-A, it is possible to add various organic or inorganic filler. Note that provision of fillers tends to result in a lower adhesiveness and/or an improved elongation modulus of the obtained layer-A.

It is important that the above-described "other component" is a combination such that: (i) the surface of the layer-A is roughened but not to the extent that the formation of fine wiring is negatively affected; and that (ii) the adhesiveness between the layer-A and an electroless plating layer is decreased. An extra caution is required for this point.

Further, examples of other technique to reduce the adhesiveness are: mechanical roughening process such as a polishing process using an abrading agent or a sandblasting process; chemical roughening process such as dipping of a target into an alkaline solution; or surface modification by irradiation of an electron ray, ultraviolet ray, or plasma. As in the above, it is important to combine the techniques: (i) the surface of the layer-A is roughened but not to the extent that the formation of fine wiring is negatively affected; and that (ii) the adhesiveness between the layer-A and an electroless plating layer is decreased. An extra caution is required for this point.

As described, the adhesiveness of the layer-A of the present invention is made 1.0 N/25 mm or less by: setting within a specific range the concentration of the diamine, having at least one of the structures represented by Formulas (1) through (6), in the entire diamine component; providing polyimide resin having at least one of the structures represented by Formulas (1) through (6) and another component; and/or conducting surface roughening process or surface modification. As described, by adjusting the adhesiveness within a specific range, a high adhesive force is achieved and good formation of electrode plating are possible. Further, an excellent formability of fine circuit is achieved in the case of a printed-wiring board.

The surface roughness of the layer-A of the present invention is preferably such that an arithmetic mean roughness Ra measured at a cutoff value of 0.002 mm is less than 0.5 μm. Accordingly, the layer-A of the present invention is remarkably smooth, when observing the surface roughness of a microscopic range. Thus, no negative effect is caused even in a case of forming fine wiring such that line and space is 10 μm/10 μm or less.

With these conditions being met, the plating-target material of the present invention allows a good formation of fine wiring when used for a printed-wiring board. The layer-A having such a surface can be formed by a suitable combination of the following methods (1) through (4).

(1) Carrying out no surface treatment with respect to a plating-target material of the present invention or a sheet-like plating-target material. The plating-target material of the present invention is given by providing on a desirable material a resin solution which includes a polyimide resin or the like constituting the plating-target material of the present invention, through a known method such as coating method using a spray, or a spin coating method. The sheet-like plating-target material is manufactured by applying by flow-casting the resin solution on a supporting member, and drying the supporting member.

(2) Suitably selecting the roughness of a surface of a material, such as a supporting member or an inserted sheet, which surface contacts the layer-A, and which surface is subjected to electroless plating.

(3) Suitably selecting the surface roughness of a layer which contacts the layer-A, in a case where the sheet is constituted of two or more layers including at least the layer-A having a surface-A to be subjected to the electroless plating.

(4) Suitably selecting composition of the polyimide resin to be included in the layer-A or drying conditions at the time of forming the layer-A.

Specifically, it is preferable not to carry out a physical surface roughening process such as a sandblasting process or the like, or a chemical surface roughening process using an alkaline solution made by combining an alkali-soluble component.

Further, if the plating-target material of the present invention is a sheet formed on a supporting member, it is preferable that the surface of the supporting member be sufficiently smooth. Further, if the plating-target material is laminated on an internal wiring board by using the sheet, it is preferable that the surface of the inserted sheet which faces the sheet at the time of lamination be made sufficiently smooth. Accordingly, the surface roughness of the supporting member or the inserted sheet is preferably such that an arithmetic mean roughness Ra measured at a cutoff value of 0.002 mm is 0.5 μm or less.

In a case where the sheet has two or more layers including at least the layer-A to be subjected to electroless plating, the surface roughness of a layer contacting the layer-A may influence the surface of the layer-A. For this reason, it is preferable that the surface of the layer contacting the layer-A be also made sufficiently smooth. Accordingly, the surface roughness of the layer contacting the layer-A is preferably such that an arithmetic mean roughness Ra measured at a cutoff value of 0.002 mm is 0.5 μm or less.

Further, the surface roughness of the layer-A to be subjected to the electroless plating varies depending on the type and compounding ratio of the acid dianhydride component and/or diamine component used in the polyimide resin included in the layer-A. For example, in the case of using a diamine having the structure of the Formula (6), a phase separation may occur thus increasing the value of Ra, depending on the type of the acid dianhydride or the other diamine component used in combination.

Further, in the case of mixing a polyimide resin having a siloxane bond or a polyimide resin having the structure of the Formula (6) with a thermoplastic resin, a phase separation may occur thus increasing the value of Ra. Further, drying conditions are also considered.

In the layer-A of the present invention to be subjected to electroless plating, the roughness of a surface in a microscopic area is small. Therefore, the surface roughness varies depending on a combination of the composition of the polyimide resin in the layer-A, and conditions for drying the layer-A. Accordingly, the targeted roughness may be achieved by varying in many ways the composition of the polyimide resin and the conditions of drying the layer-A, while confirming whether or not the targeted surface roughness is achieved.

Furthermore, a phase separation may also take place thus increasing the value of the Ra in a case of using other components, depending on the blending quantity and the combination of the resins. Accordingly, a targeted roughness may be achieved by varying in many ways the blending quantity of the other component and the type of resins, while confirming whether or not the targeted surface roughness is obtained.

Furthermore, the elongation modulus of a sheet made of the layer-A of the present invention can be made within a range from 0.1 GPa to 1.8 GPa, inclusive, by: (i) adjusting, to a specific range, the molar concentration of the diamine having the structure of the Formulas (1) through (6) in the entire diamine component; and/or (ii) providing a polyimide resin having a siloxane bond or a polyimide resin having the structure of the Formula (6), and another component. By adjusting the elongation modulus within the specific range, high adhesive force is achieved, and a good formation of electroless plating is possible.

In addition, for the purpose of further improving the adhesiveness of the electroless plating layer, various additives may be contained in the layer A by adding to a plating-target material, or applying the additives to the surface of the plating-target material. An example of such an additive is an organic thiol compound. However, the additive is not limited to this.

(Other Layers)

The plating-target material of the present invention can be any material of any structure, provided that the layer-A is included. For example, when applying the plating-target material of the present invention to a printed-wiring board (particularly to a rigid printed-wiring board such as a buildup wiring board), the plating-target material may be: a material including only the layer-A; a material including the layer-A and a layer-B which faces a circuit having been formed; or a material including the layers A and B, and a polymer film C interposed between these layers. Furthermore, when applying the plating-target material of the present invention to a printed-wiring board (particularly to flexible printed-wiring board), the plating-target material may be: a material including the layer-A and a polymer C; or a material including two layers-A and a polymer film C interposed between these layers.

The layer-B needs an excellent workability so that, when it is laminated on a surface having a circuit formed thereon, the layer-B fills up a gap between circuits. Generally, a thermosetting resin is excellent in workability, and therefore the layer-B preferably includes a thermosetting resin. Examples of such a thermosetting resin composition are: (A) thermosetting resin such as epoxy resin, phenol resin, thermosetting polyimide resin, cyanate ester resin, hydrosilyl cured resin, bis maleimide resin, bis allyl-nadi-imideresin, acrylic resin, methacrylate resin; allyl resin, unsaturated polyester resin, or the like; or (B) a thermosetting resin composition such that a side-chain reactive group thermosetting polymer, having a reactive group (such as an allyl group, a vinyl group, an alkoxysilyl group, a hydrosilyl group, or the like) at a side-chain or an end of polymer chain thereof, is combined with a suitable hardener or thermosetting catalyst. It is also preferable to further add thermoplastic polymer to the thermosetting resin composition. Preferred examples of thermosetting resin composition containing a thermoplastic polymer are: a thermosetting resin composition including epoxy resin and phenoxy resin; a thermosetting resin composition including epoxy resin and thermoplastic polyimide resin; or a thermosetting resin composition including cyanate resin and thermoplastic polyimide resin. The most preferable amongst these is the thermosetting resin composition including epoxy resin and thermoplastic polyimide resin. This is because the epoxy resin and thermoplastic polyimide resin are excellent in how the characteristics required in a plating-target material are balanced. Further, it is possible to combine various fillers for a purpose of causing expression of low-heat distensibility.

The polymer film C is not particularly limited, and various polymer films are adoptable. However, in terms of heat resistance and low-heat distensibility, the polymer film C is preferably a non-thermoplastic polyimide film.

The plating-target material of the present invention having at least the layer-A to be subjected to electroless plating is excellent in adhesiveness to an electroless plating, even without a surface treatment. However, it is possible to conduct a surface treatment with respect to the plating-target material. Note however that, when using the plating-target material for a printed-wiring board, the plating-target material needs to have a surface roughness such that formation of wiring is not negatively affected.

In some cases, the plating-target material or insulative sheet of the present invention is subjected to an alkaline treatment such as desmearing, prior to formation of an electroless plating film. The alkaline treatment such as desmearing roughens a surface of an epoxy resin material or the like which is a conventionally known material. On the contrary, the use of a polyimide resin (particularly the one having at least one of the structures of the Formulas (1), (2), (4) or (6)) as the surface-A of the present invention to be subjected to electroless plating keeps its surface from being roughened by the alkaline treatment such as desmearing, and therefore the surface is kept smooth and a firm formation of electroless plating film is possible.

(Electroless Plating)

An electroless plating to be formed on the layer-A of the plating-target material of the present invention can be: an electroless copper plating; an electroless nickel plating; an electroless gold plating; an electroless silver plating; an electroless tin plating; or the like. These platings are useable in the present invention. However, from the industrial view point and the view point of electric property such as anti-migration characteristic, the electroless plating is preferably or an electroless copper plating an electroless nickel plating, and more preferably, an electroless copper plating.

(Solution of the Present Invention)

A solution of the present invention is a solution including a polyimide resin for forming the layer-A, which resin having at least one of the structures respectively represented by the Formulas (1) through (6). As described, the solution may contain a component other than the polyimide resin, and the solvent may be any solvent which dissolves these resin components. Here, the wording "dissolve" means that the solvent dissolves at least 1 wt. % of the resin component in the solvent. The layer-A is formed by applying this solution on a desirable material through a known method such as dipping, coating by using a spray, spin-coating, or the like, and then drying the material thereafter.

Further, a solution of the present invention is a solution including a polyamic acid for forming the layer-A, which acid having at least one of the structures respectively represented by the Formulas (1) through (6). As described, the solution may contain a component other than the polyamic acid, and the solvent may be any solvent which dissolves these resin components. Here, the wording "dissolve" means that the solvent dissolves at least 1 wt. % of the resin component in the solvent. The layer-A is formed by applying this solution on a desirable material through a known method such as dipping, coating by using a spray, spin-coating, or the like, and then causing an imidizing reaction thereafter. As described, the imidizing reaction may be carried out through a thermal cure in which the polyamic acid solution is dehydrated by a heat-treatment, or a chemical cure in which the dehydration is caused by using a dehydrating agent. It is also possible to adopt a method of imidizing by heating process under a reduced pressure. In terms of simplicity of the process and the production efficiency, the thermal cure in which dehydration is done by a heat-treatment is preferable for imidization.

(Form and Manufacturing Method of the Plating Target of the Present Invention)

Next described is a manufacturing method of the plating-target material of the present invention.

One embodiment of the plating-target material of the present invention is a solution containing a polyimide resin. For example, it is possible to manufacture the solution for forming the layer-A to be subjected to electroless plating, and then form the layer-A by (i) applying the solution on a desirable material such as an internal wiring board or a polymer film, through a known method such as dipping, coating by using a spray, spin-coating, or the like, and (ii) drying the material thereafter. Here, for the purpose of adjusting the adhesiveness within a range of the present invention, it is preferable that the material be dried under conditions that allows a volatile matter to be sufficiently removed. Specifically, it is preferable that the volatile matter is sufficiently evaporated so that, when conducting a measurement using TGA measurement device (TGA-50, Shimadzu Corporation) under the condition of 20° C./min, the weight variation between 20° C. to 20° C. of a temperature-Tg curve is less than 1%.

Another embodiment of the plating-target material of the present invention is a polyamic acid solution. For example, it is possible to manufacture the solution for forming the layer-A to be subjected to the electroless plating, and then form the layer-A by (i) applying the solution on a desirable material such as an internal layer wiring board or a polymer film, through a known method such as dipping, coating by using a spray, spin-coating, or the like, and (ii) causing an imidizing reaction thereafter. Here, for the purpose of adjusting the adhesiveness within a range of the present invention, it is preferable that the material be dried under conditions that allows a volatile matter to be sufficiently removed. Specifically, it is preferable that the volatile matter is sufficiently evaporated so that, when conducting a measurement using TGA measurement device (TGA-50, Shimadzu Corporation) under the condition of 20° C./min, the weight variation between 20° C. to 200° C. of a temperature-Tg curve is less than 1%.

Further another embodiment of the plating-target material of the present invention is a sheet. For example, a sheet having the layer-A is manufactured by applying by flow-casting, on a supporting member, a solution for forming the layer-A to be subjected to electroless plating, and then drying the supporting member thereafter. The layer-A can be formed on a desirable material such as an internal wiring board or a polymer film, by laminating the sheet on the material. Note that the layer-A of the present invention is a layer of 10 Å or more in thickness, as described above.

The embodiment and the using method of the plating-target material of the present invention is not limited to the above examples.

<Printed-Wiring Board>

The plating-target material of the present invention is suitably applicable to a printed-wiring board. Here, a printed-wiring board can be manufactured by using the sheet plating-target material of the present invention, through the following method. Namely, (i) a plating-target material in the form of sheet having a resin-film base material and (ii) an internal layer substrate on which a circuit pattern is formed are laminated in this order. Then, the resin-film base material is peeled off, and an electroless plating is conducted with respect to the surface of the layer-A which is exposed by peeling the resin-film base material. Thus, a metal layer for a circuit patter is formed.

When a flexible printed-wiring board is used as the internal layer substrate in the above case, a multilayered flexible wiring board is manufactured. Further, by using a printed-wiring board using a glass-epoxy base material or the like, a multilayered rigid wiring board or a buildup wiring board is manufactured. In a case of a multilayered printed-wiring board, it is necessary to form a via to establish electric connection in the vertical direction. However, a printed-wiring board of the present invention allows formation of a via through a known method such as lasing, mechanical drilling, punching or the like, and allows the formed via to be subjected to a process (such as electroless plating) to make the via electrically conductive.

For laminating process, a thermo compression bonding treatment can be carried out. Examples of the thermo compression bonding are: a hot-press treatment; a vacuum press treatment; a heat-laminating process; a vacuum laminating treatment; a heat-roll laminating treatment; a vacuum heat-roll laminating treatment; or the like. Amongst these, a treatment under vacuum environment (i.e., vacuum press treatment, vacuum laminating treatment, and vacuum heat roll laminating treatment) is preferable as the gap between the circuits is filled up without forming a void.

Further, for a purpose of improving the adhesiveness between the layer-A and an electroless plating layer, it is possible to carry out a thermal treatment after the formation of the electroless plating layer.

The embodiment of the present invention is described in further detail with reference to the following examples. Needless to say that the present invention is not limited to the following examples, and various forms are possible in the detail. Further, the invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

EXAMPLE

The following provides a specific explanation of the present invention. However, the present invention is not limited to this. It is obvious to a person with ordinary skills in the art that the present invention can be varied, corrected, and modified in many ways within the scope of the present invention. The properties of the plating-target material of the present invention are evaluated and calculated as follows. The evaluated or calculated properties are: adhesiveness to an electroless-plated copper; surface roughness Ra; adhesiveness; elongation modulus; and formability of wiring.

[Evaluation of Adhesiveness]

A material including (i) a plating-target material having the layer-A and (ii) a supporting member was manufactured. Then, the plating-target material and the glass epoxy substrate FR-4 (Product No.: MCL-E-67, produced by Hitachi Chemical Co., Ltd.; thickness of copper foil=50 μm, the entire thickness=1.2 mm) were faced each other. Then, a hot-pressing process was conducted with respect to the FR-4, under the following conditions. The temperature was 170° C., and the pressure was 1 MPa. Furthermore, the process was carried out under vacuum environment for 6 min. Then, the polyethylene terephthalate film was peeled off, and the material was heated at 130° C. for 10 min., at 150° C. for 10 min.; and at 180° C. for 30 min. Thus, a lamination of the plating-target material having the layer-A and FR-4 was obtained. After that, a copper layer was formed on the exposed layer-A. The copper layer was formed as follows. Namely, desmearing and electroless copper plating were performed, and an electrolysis copper plating layer of 18 μm in thickness was formed on the electroless-plated copper. After that, a drying process was conducted at 180° C. for 30 min. Then, the adhesive strength was measured according to JPCA-BU01-1998 (Published by Japan Printed Circuit Association). The measurement was conducted in the ordinary state, and after a pressure-cooker test (PCT). The desmearing and the electroless copper plating were conducted as shown by the following Tables 1 and 2.

Adhesive strength in the ordinary state: Adhesive strength measured after leaving the material for 24 hours, at a temperature of 25° C., and 50% atmosphere.

Adhesive strength after PCT: Adhesive strength measured after leaving the material for 96 hours at 121° C., and 100% atmosphere.

TABLE 1

| Process | Liquid Composition | | Process Temp. | Process Time |
|---|---|---|---|---|
| Swelling | Swelling Dip Securiganth P | 500 ml/l | 60° C. | 5 min. |
| | Sodium Hydroxide | 3 g/l | | |
| Water Washing | | | | |
| Micro Etching | Concentrate Compact CP | 550 ml/l | 80° C. | 5 min. |
| | Sodium Hydroxide | 40 g/l | | |
| Water Washing | | | | |
| Neutralization | Reduction Solution Securiganth P500 | 50 ml/l | 40° C. | 5 min. |
| | Sulfuric Acid | 70 ml/l | | |

TABLE 2

| Process Name | Liquid Composition | | Process Temp. | Process Time |
|---|---|---|---|---|
| Cleaner | Cleaner Securiganth 902 | 40 ml/l | 60° C. | 5 min. |
| Conditioner | Cleaner Additive 902 | 3 ml/l | | |
| | Sodium Hydroxide | 20 g/l | | |
| Water Washing | | | | |
| Predipping | Predip Neoganth-B | 20 ml/l | Room Temp. | 1 min. |
| | Sulfuric Acid | 1 ml/l | | |
| Addition of Catalyst | Activator Neoganth 834 Conc | 40 ml/l | 40° C. | 5 min. |
| | Sodium Hydroxide | 4 g/l | | |
| | Boric Acid | 5 g/l | | |
| Water Washing | | | | |
| Activation | Reducer Neoganth | 1 g/l | Room Temp. | 2 min. |
| | Sodium Hydroxide | 5 g/l | | |
| Water Washing | | | | |
| Electroless Copper Plating | Basic Solution Printganth MSKDK | 80 ml/l | 32° C. | 15 min. |
| | Kappa Solution Printganth MSK | 40 ml/l | | |
| | Reducer Cu | 14 ml/l | | |
| | Stabilizer Printganth MSKDK | 3 ml/l | | |

[Measurement of Surface Roughness Ra]

A sample was prepared following the steps of manufacturing the sample for measuring the adhesiveness, up to the step where the desmearing process was carried out. This sample was used for measuring the surface roughness Ra of the layer-A. The measurement was conducted by using a light wave interference type surface roughness measure (NewView 5030 System produced by ZYGO Corporation). The measurement conditions are as follows.
(Measurement Conditions)
Object Lens: ×50 Mirau
Image Zoom: 2
FDA Res: Normal
Analysis Condition:
Remove: Cylinder
Filter: High Pass
Filter Low Waven: 0.002 mm

[Adhesiveness]

A rubber roller was reciprocated once at a speed of approximately 300 mm/min, on a surface having the layer-A and the SUS302 steel plate, so as to combine them by applying a load of 2000 g. This sample was used for measuring the 90° anti-peeling adhesive force, by carrying out a 90° peeling test at a speed of 300 mm/min.

[Elongation Modulus]

A component made of the layer-A is made into a sheet. Then, the elongation modulus was measured according to the elongation modulus measurement method defined by JISK 7127. The sheet to be measured was sufficiently dried, and it was confirmed that the weight variation between 20° C. to 200° C. of a temperature-Tg curve was less than 1%, when measured by using TGA (TGA-50, Shimadzu Corporation) under the condition of 20° C./min.

Specifically, the sheet was manufactured as follows. First, a resign solution for forming the layer-A of the present invention was prepared. This solution was cast and applied on a shining surface of a rolled copper foil (BHY22BT, Produced by Japan Energy Corporation), and was dried by heating in a hot-blast oven, at 60° C. for 1 min.; 80° C. for 1 min.; 100° C. for 3 min.; 120° C. for 1 min.; 140° C. for 1 min.; 150° C. for 3 min.; 180° C. for 60 min.; and at 200° C. for 10 min. After that, the rolled copper foil was removed by etching by using an etchant of a hydrochloric acid/ferric chloride series. Thus, a sheet of 25 μm in thickness, made of the layer-A, was obtained. Then, the sheet having been dried at 60° C. for 30 min was obtained. The sheet was cut into 10 mm in width and 80 mm in length. Then, the elongation modulus was measured by conducting a tension test in the ordinary state, with the chuck interval of 60 mm, at the speed of 5 mm/min.

[Formability of Wiring]

A material including (i) a plating-target material having the layer-A and (ii) a supporting member was manufactured. Then, the plating-target material and the glass epoxy substrate FR-4 (Product No.: MCL-E-67, produced by Hitachi Chemical Co., Ltd.; thickness of copper foil=50 μm, the entire thickness=1.2 mm) were processed, and the wiring side of the FR-4 (thickness of wiring is 12 μm) on which wiring has been formed. Then, a hot-pressing process was conducted with respect to the FR-4, under the following conditions. The temperature was 170° C., and the pressure was 1 MPa. Furthermore, the process was carried out under vacuum environment for 6 min. Then, the polyethylene terephthalate film was peeled off, and the material was heated at 130° C. for 10 min., at 150° C. for 10 min.; and at 180° C. for 30 min. Thus, a lamination of the plating-target material having the layer-A and FR-4 was obtained. Then, by using UV-YAG laser, a via hole of 30 μm in inner diameter was perforated above an electrode of FR-4 inside, in such a manner that the via hole reaches the electrode. Next, electroless copper plating was conducted with respect to the entire surface, and a heat treatment was carried out at 180° C. for 30 min. After that, a resist pattern was formed on the copper plating layer having been formed, and electrolysis copper plating of 10 μm in thickness was formed. The resist patter was then peeled off, and the exposed copper plating was removed by using the etchant of the hydrochloric acid/ferric chloride series. Thus, a printed-wiring board having wiring whose line-and-space (L/S)=100 μm/100 μm, and L/S=10 μm/10 μm was manufactured. The formability of wiring was evaluated as follows: a ○ indicates that wiring of the printed-wiring board was manufactured without discontinuation or defective shape; and an "x" indicates that the formed wiring on the printed-wiring bard had discontinuation and/or a defective shape.

Composition Example 1

Polyimide Resin 62 g (0.075 mol) of KF8010 (Produced by Shin-Etsu Chemical Co., Ltd.), 15 g (0.075 mol) of 4,4'-diaminodiphenyl ether, and N,N-dimethyl formamide (Hereinafter, DMF) were placed into a 2000 ml glass flask, and were dissolved by agitation. Then, 78 g (0.15 mol) of 4,4'-(4,4'-isopropylidene diphenoxy)bis(phthalic anhydride) was added, and the mixture was further agitated for approximately one hour, to produce a DMF solution of a polyamic acid with solid content concentration of 30%. The polyamic acid solution was placed in a Teflon®-coated bat, and was heated under a reduced pressure for 120 min in a vacuum oven, at 200° C., and 665 Pa. Thus, a polyimide resin 1 was obtained.

Composition Example 2

Polyimide Resin 37 g (0.05 mol) of KF8010 (Produced by Shin-Etsu Chemical Co., Ltd), 21 g (0.10 mol) of 4,4'-diaminodiphenyl ether, and DMF were placed into a 2000 ml glass flask, and were dissolved by agitation. Then, 4,4'-(4,4'-isopropylidene diphenoxy)bis(phthalic anhydride) 78 g (0.15 mol) was added, and the mixture was further agitated for approximately one hour, to produce a DMF solution of a polyamic acid with solid content concentration of 30%. The polyamic acid solution was placed in a Teflon®-coated bat, and was heated under a reduced pressure for 120 min in a vacuum oven, at 200° C., and 665 Pa. Thus, a polyimide resin 2 was obtained.

Composition Example 3

Polyimide Resin 123 g (0.15 mol) of KF8010 (produced by Shin-Etsu Chemical Co., Ltd.) and DMF were placed into a 2000 ml glass flask, and were dissolved by agitation. Then, 78 g (0.15 mol) of 4,4'-(4,4'-isopropylidene diphenoxy)bis(phthalic anhydride) was added, and the mixture was further agitated for approximately one hour, to produce a DMF solution of a polyamic acid with solid content concentration of 30%. The polyamic acid solution was placed in a Teflon®-coated bat, and was heated under a reduced pressure for 120 min in a vacuum oven, at 200° C., and 665 Pa. Thus, a thermoplastic polyimide resin 3 was obtained.

Composition Example 4

Polyimide Resin 41 g (0.143 mol) of 1,3-bis(3-amino phenoxy)benzene, 1.6 g (0.007 mol) of 3,3'-dihydroxy-4,4'-diaminobiphenyl, and DMF were placed in a 2000 ml glass flask, and were dissolved by agitation. Then, 78 g (0.15 mol) of 4,4'-(4,4'-isopropylidene diphenoxy)bis(phthalic anhydride) was added, and the mixture was further agitated for approximately one hour, to produce a DMF solution of a polyamic acid with solid content concentration of 30%. The polyamic acid solution was placed in a Teflon®-coated bat, and was heated under a reduced pressure for 180 min in a vacuum oven, at 200° C., and 665 Pa. Thus, a polyimide resin 4 was obtained.

Composition Example 5

Polyimide Resin 86 g (0.10 mol) of KF8010 (Produced by Shin-Etsu Chemical Co., Ltd.), 9 g (0.05 mol) of 4,4'-diaminodiphenyl ether, and DMF were placed in a 2000 ml glass flask, and were dissolved by agitation. Then, 78 g (0.15 mol) of 4,4'-(4,4'-isopropylidene diphenoxy)bis(phthalic anhydride) was added, and the mixture was further agitated for approximately one hour, to produce a DMF solution of a polyamic acid with solid content concentration of 30%. The polyamic acid solution was placed in a Teflon®-coated bat, and was heated under a reduced pressure for 120 min in a vacuum oven, at 200° C., and 665 Pa. Thus, a polyimide resin 5 was obtained.

Composition Example 6

Polyimide Resin 22 g (0.027 mol) of KF8010 (Produced by Shin-Etsu Chemical Co., Ltd.), 24.5 g (0.123 mol) 4,4'-diaminodiphenyl ether, and DMF were placed in a 2000 ml glass flask, and were dissolved by agitation. Then, 78 g (0.15 mol) of 4,4'-(4,4'-isopropylidene diphenoxy)bis(phthalic anhydride) was added, and the mixture was further agitated for approximately one hour, to produce a DMF solution of a polyamic acid with solid content concentration of 30%. The polyamic acid solution was placed in a Teflon®-coated bat, and was heated under a reduced pressure for 120 min in a vacuum oven, at 200° C., and 665 Pa. Thus, a polyimide resin 6 was obtained.

Composition Example 7

Polyimide Resin 107 g (0.13 mol) of KF8010 (Produced by Shin-Etsu Chemical Co., Ltd.), 4 g (0.02 mol) of 4,4'-diaminodiphenyl ether, and DMF were placed in a 2000 ml glass flask, and were dissolved by agitation. Then, 78 g (0.15 mol) of 4,4'-(4,4'-isopropylidene diphenoxy)bis(phthalic anhydride) was added, and the mixture was further agitated for approximately one hour, to produce a DMF solution of a polyamic acid with solid content concentration of 30%. The polyamic acid solution was placed in a Teflon®-coated bat, and was heated under a reduced pressure for 120 min in a vacuum oven, at 200° C., and 665 Pa. Thus, a polyimide resin 7 was obtained.

Composition Example 8

Polyimide Resin 16 g (0.02 mol) of KF8010 (Produced by Shin-Etsu Chemical Co., Ltd.), 26 g (0.13 mol) of 4,4'-diaminodiphenyl ether, and DMF were placed in a 2000 ml glass flask, and were dissolved by agitation. Then, 78 g (0.15 mol) of 4,4'-(4,4'-isopropylidene diphenoxy)bis(phthalic anhydride) was added, and the mixture was further agitated for approximately one hour, to produce a DMF solution of a polyamic acid with solid content concentration of 30%. The polyamic acid solution was placed in a Teflon®-coated bat, and was heated under a reduced pressure for 120 min in a vacuum oven, at 200° C., and 665 Pa. Thus, a polyimide resin 8 was obtained.

Composition Example 9

Polyimide Resin 55 g (0.045 mol) of Elasmer-1000P (Produced by Ihara Chemical Industry Co., Ltd.), 21 g (0.105 mol) of 4,4-diaminodiphenylether, and DMF were placed in a 2000 ml glass flask, and were dissolved by agitation. Then, 78 g (0.15 mol) of 4,4'-(4,4'-isopropylidene diphenoxy)bis(phthalic anhydride) was added, and the mixture was further agitated for one hour to produce a DMF solution of a polyamic acid with solid content concentration of 30%. The polyamic acid solution was placed in a Teflon®-coated bat, and was heated under a reduced pressure for 180 min in a vacuum oven, at 200° C., and 665 Pa. Thus, a polyimide resin 9 was obtained.

Composition Example 10

Polyimide Resin 92 g (0.075 mol) of ELASMER 1000P (Produced by Ihara Chemical Industry Co., Ltd.), 21 g (0.105 mol) of 4,4-diaminodiphenyl ether, and DMF were placed in a 2000 ml glass flask, and were dissolved by agitation. Then, 78 g (0.15 mol) of 4,4'-(4,4'-isopropylidene diphenoxy)bis(phthalic anhydride) was added, and the mixture was further agitated for one hour to produce a DMF solution of a polyamic acid with solid content concentration of 30%. The polyamic acid solution was placed in a Teflon®-coated bat, and was heated under a reduced pressure for 180 min in a vacuum oven, at 200° C., and 665 Pa. Thus, a polyimide resin 10 was obtained.

Blending Example 1

Solution for Forming Layer-A

A solution (a) forming layer-A was obtained by dissolving the polyimide resin of composition example 1 in dioxolan. The concentration of solid content was adjusted to 15 wt. %.

Blending Example 2

Solution for Forming Layer-A

A solution (b) for forming layer-A was obtained by dissolving the polyimide resin of composition example 2 in dioxolan. The concentration of solid content was adjusted to 15 wt. %.

Blending Example 3

Solution for Forming Layer-A

A solution (c) for forming layer-A was obtained by dissolving the polyimide resin of composition example 3 in dioxolan. The concentration of solid content was adjusted to 15 wt. %.

Blending Example 4

Solution for Forming Layer-A

A solution (d) was obtained by dissolving the polyimide resin of composition example 4 in dioxolan. The concentration of solid content was adjusted to 15%. Further, a solution (e) for forming layer-A was prepared by using X-22-8917 (polyimide silicone solution produced by Shin-Etsu Chemical Co., Ltd.; solid content concentration 20 wt. %, cyclohexanone solution). 30 g of the solution (d) and 70 g of the solution (e) were mixed to prepare a solution (f) for forming layer-A.

Blending Example 5

Solution for Forming Layer-A 32.1 g of YX4000H (biphenyl-type epoxy resin produced by Japan Epoxy Resins Co., Ltd.), 17.9 g of bis[4-(3-amino phenoxy)phenyl]sulfone (a diamine produced by Wakayama Seika Corporation), and 0.2 g of 2,4-diamino-6-[2'-undecylimidazolyl-(1')]-ethyl-s-triazine (a hardener produced by Shikoku Chemicals Corporation) were dissolved in dioxolan, to prepare a solution (g) with solid content concentration of 50%. 60 g of the solution (c) and 40 g of the solution (g) were mixed to prepare a solution (h) for forming layer-A.

Blending Example 6

Solution for Forming Layer-A

A solution (i) for forming layer-A was obtained by dissolving the polyimide resin of composition example 5 in dioxolan. The concentration of solid content was adjusted to 15 wt. %.

Blending Example 7

Solution for Forming Layer-A

A solution (j) for forming layer-A was obtained by dissolving the polyimide resin of composition example 6 in dioxolan. The concentration of solid content was adjusted to 15 wt. %.

Blending Example 8

Solution for Forming Layer-A

A solution (k) for forming layer-A was obtained by dissolving the polyimide resin of composition example 7 in dioxolan. The concentration of solid content was adjusted to 15 wt. %.

Blending Example 9

Solution for Forming Layer-A

A solution (l) for forming layer-A was obtained by dissolving the polyimide resin of composition example 8 in dioxolan. The concentration of solid content was adjusted to 15 wt. %.

Blending Example 10

Solution for Forming Layer-A

A solution (m) for forming Layer-A was obtained by mixing 70 g of the solution (k) and 30 g of the solution (d).

Blending Example 11

Solution for Forming Layer-A

A solution (n) for forming layer-A was obtained by dissolving the polyimide resin of composition example 9 in dioxolan. The concentration of solid content was adjusted to 15 wt. %.

Blending Example 12

Solution for Forming Layer-A

A solution (o) for forming Layer-A was obtained by dissolving the polyimide resin of composition example 10 in dioxolan. The concentration of solid content was adjusted to 15 wt. %.

Blending Example 13

Layer-B Forming solution

A solution (p) for forming Layer-B was obtained by mixing 50 g of the solution (d), 15 g of the solution (g), with 50 g of Adomafine S0-C5 (silica produced by Tatsumori Kabusikikaisha; average grain diameter=1.5 μm).

Example 1

The solution for forming Layer-A according to Table 3 was applied by flow-casting the solution on the surface of polyethylene terephthalate film (Product Name: Cerapeel HP produced by Toyo Metallizing Co., Ltd.) serving as a supporting member. Then, the medium with the solution was dried by heating it in a hot-blast oven, at the temperature of 60° C., 100° C., and 150° C. Thus, a material including (i) a plating-target material having a layer-A of 25 μm in thickness and (ii) the supporting member was prepared. Then, evaluation of each evaluation item was conducted, according to its evaluation steps, with respect to the material having been obtained. The measurement of the adhesiveness, was conducted with respect to the surface from which the supporting member has been peeled off. The results are shown in Table 3.

TABLE 3

| | Example 1 | Example 2 | Example 3 | Example 4 |
|---|---|---|---|---|
| Layer-A Resin Solution | (a) | (b) | (f) | (h) |
| Layer-B Resin Solution | None | None | None | None |
| Polymer Film C | None | None | None | None |
| Adhesive Force in Ordinary State | 11 N/cm | 11 N/cm | 8 N/cm | 8 N/cm |
| Post-PCT Adhesive Force | 8 N/cm | 6 N/cm | 6 N/cm | 5 N/cm |
| Surface Roughness Ra | 0.02 μm | 0.01 μm | 0.07 μm | 0.10 μm |
| Adhesiveness | <0.01 N/25 mm | <0.01 N/25 mm | <0.02 N/25 mm | <0.01 N/25 mm |
| Wiring Formability L/S = 100 μm/100 μm | ○ | ○ | ○ | ○ |
| Wiring Formability L/S = 10 μm/10 μm | ○ | ○ | ○ | ○ |

| | Example 5 | Example 6 | Example 7 | Example 8 |
|---|---|---|---|---|
| Layer-A Resin Solution | (a) | (a) | (n) | (o) |
| Layer-B Resin Solution | (p) | (p) | None | (p) |
| Polymer Film C | None | Apical NPI | None | None |
| Adhesive Force in Ordinary State | 11 N/cm | 11 N/cm | 7 N/cm | 7 N/cm |
| Post-PCT Adhesive Force | 8 N/cm | 8 N/cm | 4 N/cm | 3 N/cm |
| Surface Roughness Ra | 0.02 μm | 0.02 μm | 0.02 μm | 0.02 μm |
| Adhesiveness | <0.01 N/25 mm | <0.01 N/25 mm | <0.01 N/25 mm | <0.01 N/25 mm |
| Wiring Formability L/S = 100 μm/100 μm | ○ | ○ | ○ | ○ |
| Wiring Formability L/S = 10 μm/10 μm | ○ | ○ | ○ | ○ |

Examples 2 to 4

A plating-target material having a layer-A was prepared as in example 1, using the solution for forming Layer-A according to Table 3. Then, evaluation of each evaluation item was conducted, according to its evaluation steps, with respect to the sheet having been obtained. The results are shown in Table 3.

Example 5

The solution for forming Layer-A according to Table 3 was applied by flow-casting the solution on the surface of polyethylene terephthalate film (Product Name: Cerapeel HP produced by Toyo Metallizing Co., Ltd.) serving as a supporting member. Then, the medium with the solution was dried by heating in a hot-blast oven, at the temperature of 60° C. Thus, a material including (i) a plating-target material having the layer-A of 5 μm in thickness and (ii) the supporting member was prepared.

Then, the solution for forming Layer-B according to Table 3 was applied by flow-casting the solution on the layer-A. Then, the medium was dried by heating in the hot-blast oven. The heating was conducted for 1 min each at the temperatures of 80° C., 100° C., 120° C., 150° C., 170° C. Thus, a plating-target material having the both layers A and B was obtained. The thickness of the two layers was 40 μm in total. Then, evaluation of each evaluation item was conducted, according to the respective evaluation steps, with respect to a surface from which the supporting member was peeled off. The results are shown in Table 3.

Example 6

The solution for forming layer-A according to Table 3 was applied by casting on the surface of a polyimide film (Product Name: Apical NPI produced by Kaneka Corporation) of 25 μm in thickness. Then, the film was heated in a hot-blast oven at the temperature of 60° C., to produce a polyimide film having a layer-A of 5 μm in thickness.

Then, the solution for forming layer-B according to Table 3 was applied by flow-casting the solution on the other surface of the polyimide film, which surface was opposite to the surface where the layer-A was formed. Then, the film was dried by heating in the hot-blast oven. The heating was conducted for 1 min each at the temperatures of 80° C.; 100° C.; 120° C.; 150° C.; and 170° C. Thus, there is obtained a plating-target material including: the layer-A of 5 μm in thickness; the polyimide film of 25 μm in thickness; and the layer-B of 35 μm in thickness. Then, evaluation of each evaluation item was conducted, according to its evaluation steps, with respect to the plating-target material having been obtained. The results are shown in Table 3.

Example 7

A plating-target material having the layer-A was obtained as was done in the example 1, using the solution for forming layer-A according to Tables 3 and 4. Then, evaluation of each evaluation item was conducted, according to its evaluation steps, with respect to the sheet having been obtained. The results are shown in Tables 3 and 4.

Example 8

A plating-target material having the layer-A and the layer-B was obtained as was done in the example 5, respectively using the solution for forming layer-A and the solution for forming layer-B according to Tables 3 and 4. Then, evaluation of each evaluation item was conducted, according to its evaluation steps, with respect to the sheet having been obtained. The results are shown in Tables-3 and 4.

Example 9

The solution for forming layer-A according to Table 3 was applied by flow-casting the solution on the surface of polyethylene terephthalate film (Product Name: Cerapeel HP produced by Toyo Metallizing Co., Ltd.) serving as a supporting member. Then, the medium with the solution was then dried by heating it in a hot-blast oven, at the temperature of 60° C., 100° C., and 150° C. Thus, a material including (i) a plating-target material having the layer-A of 25 μm in thickness and (ii) the supporting member was prepared. Then, evaluation of each evaluation item was conducted, according to its evaluation steps, with respect to the material having been obtained. The results are shown in Table 4.

by heating it in a hot-blast oven, at the temperature of 60° C. Thus, a material constituted of (i) a plating-target material having the layer-A of 5 μm in thickness and (ii) the supporting member was prepared.

Then, the solution for forming layer-B according to Table 3 was applied by flow-casting the solution on the layer-A, and the medium was dried by heating in a hot-blast oven. The heating was conducted for 1 min each at the temperatures of 80° C., 100° C., 120° C., 150° C., 170° C. Thus, a plating-target material having the both layers A and B was obtained. The thickness of the two layers was 40 μm in total. Then, evaluation of each evaluation item was conducted, according to its evaluation steps, with respect to the plating-target material having been obtained. The results are shown in Table 4.

TABLE 4

|  | Example 7 | Example 8 | Example 9 | Example 10 | Example 11 |
|---|---|---|---|---|---|
| Layer-A Resin Solution | (n) | (o) | (a) | (b) | (i) |
| Layer-B Resin Solution | None | (p) | None | None | None |
| Polymer Film C | None | None | None | None | None |
| Adhesive Force in Ordinary State | 7 N/cm | 7 N/cm | 11 N/cm | 11 N/cm | 8 N/cm |
| Post-PCT Adhesive force | 4 N/cm | 3 N/cm | 8 N/cm | 6 N/cm | 6 N/cm |
| Surface Roughness Ra | 0.02 μm | 0.02 μm | 0.02 μm | 0.01 μm | 0.07 μm |
| Elongation Modulus | 1.4 Gpa | 0.4 Gpa | 0.9 Gpa | 1.4 Gpa | 0.2 Gpa |
| Wiring Formability L/S = 100 μm/100 μm | ◯ | ◯ | ◯ | ◯ | ◯ |
| Wiring Formability L/S = 10 μm/10 μm | ◯ | ◯ | ◯ | ◯ | ◯ |

|  | Example 12 | Example 13 | Example 14 | Example 15 |
|---|---|---|---|---|
| Layer-A Resin Solution | (j) | (m) | (a) | (a) |
| Layer-B Resin Solution | None | None | (p) | (p) |
| Polymer Film C | None | None | None | Apical NPI |
| Adhesive Force in Ordinary State | 7 N/cm | 8 N/cm | 11 N/cm | 11 N/cm |
| Post-PCT Adhesive force | 4 N/cm | 5 N/cm | 8 N/cm | 8 N/cm |
| Surface Roughness Ra | 0.10 μm | 0.10 μm | 0.02 μm | 0.02 μm |
| Elongation Modulus | 1.8 Gpa | 0.3 Gpa | 0.9 Gpa | 0.9 Gpa |
| Wiring Formability L/S = 100 μm/100 μm | ◯ | ◯ | ◯ | ◯ |
| Wiring Formability L/S = 10 μm/10 μm | ◯ | ◯ | ◯ | ◯ |

Examples 10 to 13

Plating target having the layer-A was prepared as in example 1, using the solution for forming layer-A according to Table 3. Then, evaluation of each evaluation item was conducted, according to its evaluation steps, with respect to the sheet having been obtained. The results are shown in Table 4.

Example 14

The solution for forming layer-A according to Table 4 was applied by flow-casting the solution on the surface of polyethylene terephthalate film (Product Name: Cerapeel HP produced by Toyo Metallizing Co., Ltd.) serving as a supporting member. Then, the medium with the solution was then dried

Examples 15

The solution for forming layer-A according to Table 3 was applied by casting on the surface of a polyimide film (Product Name: Apical NPI produced by Kaneka Corporation) of 25 μm in thickness. Then, the film was heated in a hot-blast oven at the temperature of 60° C., to produce a polyimide film having a layer-A of 5 μm in thickness.

Then, the solution for forming layer-B according to Table 3 was applied by flow-casting the solution on the other surface of the polyimide film, which surface was opposite to the surface where the layer-A was formed. Then, the film was dried by heating in the hot-blast oven. The heating was conducted for 1 min each at the temperatures of 80° C.; 100° C.; 120° C.; 150° C.; and 170° C. Thus, there is obtained a plating-target material sequentially including: the layer-A of 5 μm in thickness; the polyimide film of 25 μm in thickness; and the layer-B of 35 μm in thickness. Then, evaluation of each evaluation item was conducted, according to its evaluation steps, with respect to the plating-target material having been obtained. The results are shown in Table 4.

Comparison Example 1

Evaluation of each evaluation item was conducted, according to its evaluation steps, as was done in example 1, except in that the solution (c) was used. The results are shown in Table 5. As is obvious from Table 5, the adhesive strength is very high despite the smooth surface. However, the adhesiveness of the surface caused a foreign material to adhere to the surface. Therefore, formation of fine wiring was not possible.

TABLE 5

|  | Comparative Example 1 |
|---|---|
| Layer-A Resin Solution | (c) |
| Layer-B Resin Solution | None |
| Polymer Film C | None |
| Adhesive Force in Ordinary State | 8 N/cm |
| Post-PCT Adhesive force | 6 N/cm |
| Surface Roughness Ra | 0.02 μm |
| Adhesiveness | 1.6 N/25 mm |
| Wiring Formability L/S = 100 μm/100 μm | × Adhesion of foreign material and defective shape of wiring was partly found |
| Wiring Formability L/S = 10 μm/10 μm | × Adhesion of foreign material, defective shape of wiring, and many discontinuations of wiring was found |

Comparison Example 2

Evaluation of each evaluation item was conducted, according to its evaluation steps, as was done in example 1, except in that the solution (p) was used. The results are shown in Table 6. As is obvious from Table 6, the adhesive strength is low when the elongation modulus is large.

TABLE 6

|  | Comparative Example 2 |
|---|---|
| Layer-A Resin Solution | (l) |
| Layer-B Resin Solution | None |
| Polymer Film C | None |
| Adhesive Force in Ordinary State | 3 N/cm |
| Post-PCT Adhesive Force | 0.2 N/cm |
| Surface Roughness Ra | 0.02 μm |
| Elongation Modulus | 2.0 GPa |
| Wiring Formability L/S = 100 μm/100 μm | × Peeling of wiring occurred due to adhesion defective between wiring and Layer-A |
| Wiring Formability L/S = 10 μm/10 μm | × Peeling of wiring occurred due to adhesion defective between wiring and Layer-A |

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

A plating-target material of the present invention has a high adhesiveness to not only various materials, but also an electroless plating film. Further, the plating-target material of the present invention has a high adhesiveness to an electroless plating film, even if the surface is not so rough. Since, an electroless plating can be favorably formed on the entire surface of a layer-A of the plating-target material, the plating-target material is particularly suitable for use in manufacturing of a printed-wiring board. Further, since the adhesiveness of the surface is low, the electroless plating is favorably formed on the surface of the plating-target material. This makes the plating-target material particularly suitable for use in manufacturing of the printed-wiring board. Thus, the present invention is suitably applied to an industry of processing materials such as resin composition or adhesives, various chemical industries, as well as industries related to various electronic components.

The invention claimed is:

1. A laminate, comprising a layer-A;
wherein the layer-A contains a polyimide resin having a structure represented by Formula (6), and a surface roughness of the layer-A is such that an arithmetic mean roughness of measurement at a cutoff value of 0.002 mm is less than 0.5 μm and an anti-peeling adhesive force of a surface of the layer-A is 1.0 N/25 mm or less,

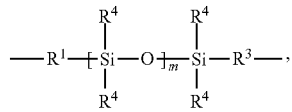

(Formula 6)

where each of $R^1$ and $R^3$ represents a bivalent alkylene group represented by $C_xH_{2x}$ or a bivalent aromatic group, $R^4$ represents an alkyl group, a phenyl group, an alkoxy group, or a phenoxy group, and m is an integer not less than 1;
wherein the layer-A is subjected to electroless copper plating; and
wherein the polyimide resin is formed by polymerizing a diamine component and a content of a diamine component having a structure represented by Formula (6) is 5 to 95 mol % based on the entire diamine component.

2. A laminate, comprising a layer-A;
wherein the layer-A contains a polyimide resin having a structure represented by Formula (6), and an elongation modulus of the layer-A in a sheet shape is 1.8 GPa or less and an anti-peeling adhesive force of a surface of the layer-A is 1.0 N/25 mm or less,

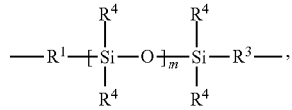

(Formula 6)

where each of $R^1$ and $R^3$ represents a bivalent alkylene group represented by $C_xH_{2x}$ or a bivalent aromatic group, $R^4$ represents an alkyl group, a phenyl group, an alkoxy group, or a phenoxy group, and m is an integer not less than 1;

wherein a surface roughness of the layer-A is such that an arithmetic mean roughness of measurement at a cutoff value of 0.002 mm is less than 0.5 μm;

wherein the layer-A is subjected to electroless copper plating; and wherein the polyimide resin is formed by polymerizing a diamine component and a content of a diamine component having a structure represented by Formula (6) is 5 to 95 mol % based on the entire diamine component.

3. The laminate as set forth in claim 2, wherein the elongation modulus is 0.1 GPa or more.

4. A printed-wiring board, prepared by forming a circuit pattern on the surface of the layer-A of the laminate as set forth in claim 1.

5. A printed-wiring board, prepared by forming a circuit pattern on the surface of the layer-A of the laminate as set forth in claim 2.

* * * * *